(12) United States Patent
Dinwiddie et al.

(10) Patent No.: US 11,837,970 B2
(45) Date of Patent: Dec. 5, 2023

(54) POWER RECEIVER INCLUDING FARADAY CAGE FOR EXTRACTING POWER FROM ELECTRIC FIELD ENERGY IN THE EARTH

(71) Applicant: Earth Energies, Inc., Johns Creek, GA (US)

(72) Inventors: John Dinwiddie, Cary, NC (US); Terry Wright, Suwanee, GA (US)

(73) Assignee: EARTH ENERGIES, INC., John's Creek, GA (US)

( * ) Notice: Subject to any disclaimer, the term of this patent is extended or adjusted under 35 U.S.C. 154(b) by 1486 days.

(21) Appl. No.: 16/084,149

(22) PCT Filed: Mar. 10, 2017

(86) PCT No.: PCT/US2017/021779
§ 371 (c)(1),
(2) Date: Sep. 11, 2018

(87) PCT Pub. No.: WO2017/156393
PCT Pub. Date: Sep. 14, 2017

(65) Prior Publication Data
US 2020/0295677 A1  Sep. 17, 2020

Related U.S. Application Data

(60) Provisional application No. 62/306,938, filed on Mar. 11, 2016.

(51) Int. Cl.
*H02N 11/00* (2006.01)
*H01L 23/64* (2006.01)
(Continued)

(52) U.S. Cl.
CPC ........... *H02N 11/002* (2013.01); *H01F 27/29* (2013.01); *H01F 30/10* (2013.01);
(Continued)

(58) Field of Classification Search
CPC ......... H02N 11/002; H02M 11/00; H05F 7/00
See application file for complete search history.

(56) References Cited

U.S. PATENT DOCUMENTS 2,945,141 A * 7/1960 Van De Graaff ...... H02K 19/24
 313/62
3,192,414 A * 6/1965 Reusser ................... H02N 1/10
 310/309

(Continued)

*Primary Examiner* — Dang D Le
(74) *Attorney, Agent, or Firm* — COATS & BENNETT, PLLC

(57) ABSTRACT

A circuit is operative to extract electromagnetic wave energy from the ground via a resonant transformer in which resonance is triggered by electrical charge arcing across a spark gap. A center tap of the primary winding of the transformer is capacitively coupled to an electrode buried in the ground. In-rush current from the ground electrode is converted to a useful form (e.g., one- or three-phase 60 Hz AC) by a power conversion circuit connected to the secondary winding of the resonant transformer. The ground electrode of the capacitor coupling the grounded electrode to the center tap primary winding is the shield of a Faraday cage enclosing the resonant transformer, spark gap, and a high-voltage power supply exciting the spark gap.

12 Claims, 3 Drawing Sheets

(51) Int. Cl.
*H02M 11/00* (2006.01)
*H05F 7/00* (2006.01)
*H01L 23/522* (2006.01)
*H01F 27/29* (2006.01)
*H01F 30/10* (2006.01)

(52) U.S. Cl.
CPC ........ *H01L 23/5222* (2013.01); *H01L 23/642* (2013.01); *H02M 11/00* (2013.01); *H05F 7/00* (2013.01)

(56) References Cited

U.S. PATENT DOCUMENTS

| | | |
|---|---|---|
| 5,590,031 A | 12/1996 | Mead |
| 6,222,260 B1 | 4/2001 | Liang |
| 2015/0102675 A1 | 4/2015 | Dinwiddie |

\* cited by examiner

POWER RECEIVER INCLUDING FARADAY CAGE FOR EXTRACTING POWER FROM ELECTRIC FIELD ENERGY IN THE EARTH

FIELD OF INVENTION

The present invention relates generally to renewable energy, and more particularly to methods and apparatus for extracting energy from subsurface electrical fields beneath the earth's surface.

BACKGROUND

It is hypothesized that there exists standing electromagnetic waves beneath the surface of the earth, which resonate within the range of the Schumann resonances. Schumann resonances are global electromagnetic resonances, generated by earth's geodynamo and excited by lightning discharges in the cavity formed by the Earth's surface and the ionosphere. The Schumann resonances occur between 3 Hz and 60 Hz, with distinct peaks at extremely low frequencies (ELF) around 7.83, 14.3, 20.8, 27.3, 33.8, 39, and 45 Hz. The earth's geodynamo and its generated and rotating magnetic field, and positive lightning, are two energy sources believed to sustain the ELF standing waves within the earth. Non-resonant electromagnetic waves generated by the earth's geodynamo in the frequency range of 0.1 to 200 Hz further enrich the energy levels of the standing Schumann resonance waves at points where the resonant and non-resonance waves intersect beneath the earth's surface.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a circuit is operative to extract electromagnetic wave energy from the ground via a resonant transformer in which resonance is triggered by electrical charge arcing across a spark gap. A center tap of the primary winding of the transformer is capacitively coupled to an electrode buried in the ground. In-rush current from the ground electrode is converted to a useful form (e.g., one- or three-phase 60 Hz AC) by a power conversion circuit connected to the secondary winding of the resonant transformer. The ground electrode of the capacitor coupling the grounded electrode to the center tap primary winding is the shield of a Faraday cage enclosing the resonant transformer, spark gap, and a high-voltage power supply exciting the spark gap.

One embodiment relates to a power receiver for extracting electromagnetic wave energy from the earth's electric field. The power receiver includes a resonant transformer having a centertapped primary winding and a secondary winding. A high voltage power supply is connected across the primary winding of the resonant transformer, and a pair of electrodes separated by a spark gap is interposed between the high voltage power supply and one side of the primary winding of the resonant transformer. The electrodes are configured to generate a spark when a voltage difference between the electrodes reaches a predetermined level. The power receiver also includes a first capacitor connected between the center tap of the primary winding of the resonant transformer and a ground terminal disposed below the surface of the earth; the first capacitor is operative to capacitively couple the primary winding centertap to ground. A power conversion circuit is connected to a secondary winding of the resonant transformer, and is operative to convert electrical current flowing from the grounded electrode to a desired form. The grounded terminal of the first capacitor comprises the shield of a Faraday cage enclosing the high voltage power supply, the electrode pair, and the resonant transformer.

Another embodiment relates to a method of receiving power from the earth. A grounding electrode is disposed below the surface of the earth. A high voltage power supply, a pair of spark gap electrodes, and a resonant transformer are disposed within a coupling capacitor that also functions as a Faraday cage. The shield of the Faraday cage is electrically connected to the grounded plate of the coupling capacitor. The grounding electrode is coupled to a center tap of a primary winding of the resonant transformer via the coupling capacitor. The primary winding of the resonant transformer is excited with a high voltage pulse generated by applying a high voltage across the spark gap electrodes, causing a spark, and coupling the high voltage pulse into the primary winding. AC power from a secondary winding of the resonant transformer is converted to a useful form.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
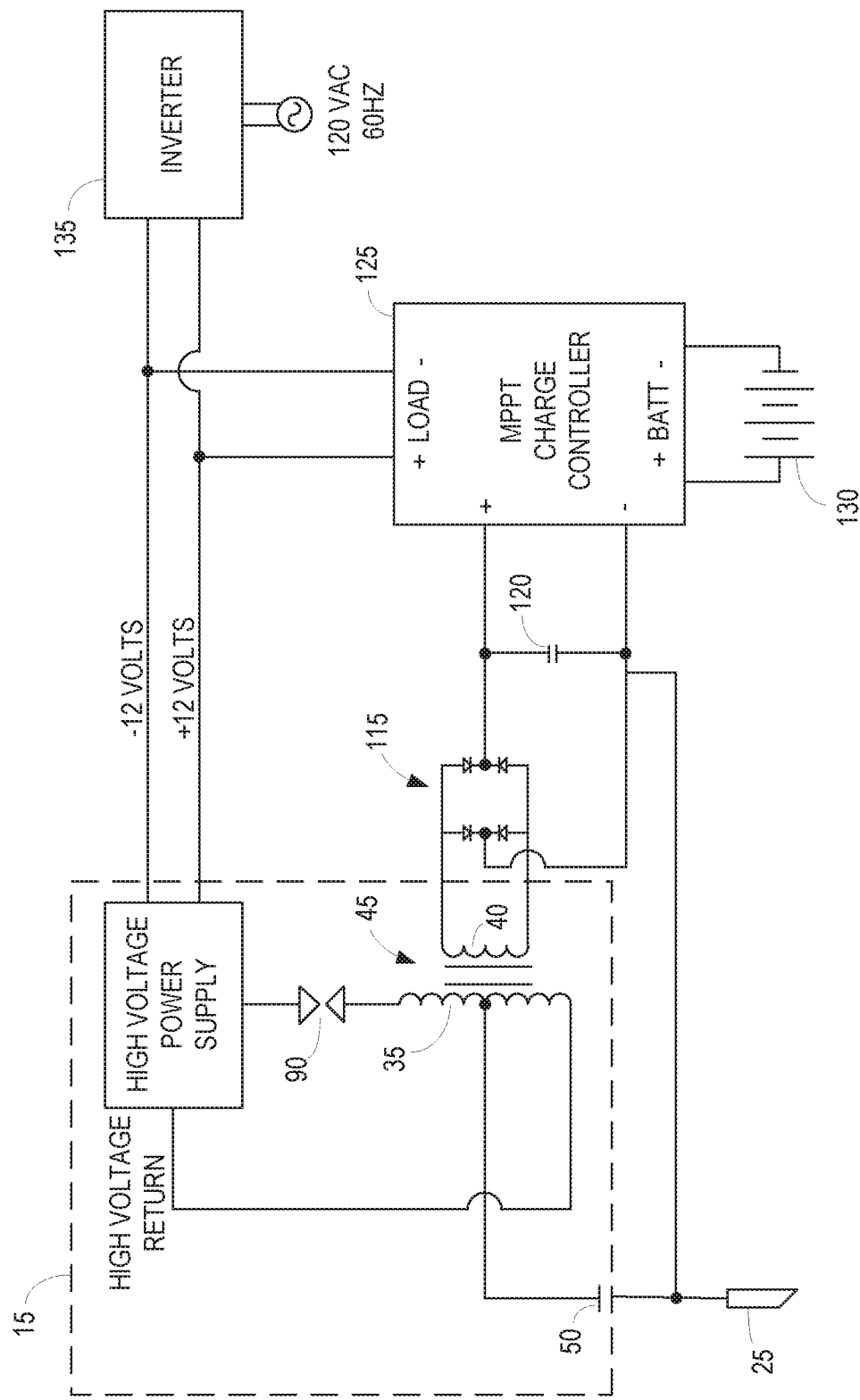
FIG. 1 is a functional electrical schematic of a circuit for receiving electrical energy from the earth.

FIG. 1 depicts a representative circuit for extracting useful electrical energy from the ground. A ground electrode 25 is disposed underground, and capacitively coupled to a resonant transformer 45 by a coupling capacitor 50. The ground electrode may comprise a ⅝-inch×8-foot copper ground rod, such as the ERICA 615880UPC. The coupling capacitor 50 connects to a center tap of a primary winding 35 of the resonant transformer. A high voltage power supply is connected across the primary winding 35, with a pair of electrodes 90 interposed between the power supply and one end of the primary winding 35. A suitable high voltage power supply is a United Nuclear supply operative to generate 25 kV DC (open circuit), from 12 V inputs at 1.0 A. The electrodes 90 are spaced apart, and operative to generate a spark when the high voltage power supply creates a voltage difference between the electrodes of a predetermined level. A suitable spark gap electrode pair is the Information Unlimited SPARKOS ¼-inch×1-inch tungsten electrodes.

The spark generates a high voltage pulse into the primary winding 35. In one embodiment, sparks are generated at a frequency of about 7.83 sparks per second and the duration of the sparks is approximately 10 microseconds. This pulse is operative to cause resonance in the transformer, in a frequency range of between about 0.1 and 200 Hz. In one embodiment, the resonant transformer has a Q factor of about 10 or greater. In one embodiment, the resonant transformer 45 has a resonance frequency of about 7.83 Hz, the fundamental Schumann resonance frequency. A suitable transformer is Allanson 1530 BPX 120R, having a primary of 120 V, 60 Hz, 450 VA and a secondary of 15 kV, 30 mA. In one embodiment, a neon sign transformer may be used in a step-down configuration, with the high voltage pulse applied to the secondary output from the primary coil.

The resonant transformer 45 includes a secondary winding 40, which is connected to a full bridge rectifier 115. A suitable rectifier is the HVP-16 Rectron Rectifier with a 750 mA, 16 kV max peak, comprising four diodes. Alternatively, a full bridge rectifier 115 may be constructed from diodes, the selection and configuration of which are well within the skill of those of ordinary skill in the art. A filter capacitor 120 connected across the output of the rectifier 115 removes unwanted frequency components from the DC current provided. A suitable capacitor 120 is a CDE 940C16VV1K-F 1 uF 1600 VDC. The filter capacitor may also be connected to the grounded electrode 25. The rectified voltage across the filter capacitor 120 is input to a DC-DC power conversion unit to optimize the DC output of the rectifier 115 to various loads.

In one embodiment, the DC-DC power converter is a maximum power point tracking (MPPT) charge controller, such as a Tracer 4215 BN MPPT Solar Charge Controller, which is commonly used in solar power generating systems. As known in the art, an MPPT controller alters the voltage and current relationship of DC power by first converting the DC input to high frequency AC (e.g., 20-80 kHz), and then converting the AC back to a different DC voltage and current that is optimized to one or more loads. For example, the MPPT charge converter 125 may apply a small amount of energy to a battery 130 to charge the battery 130, such as a 12 V, 7.0 A/H sealed lead acid battery, such as the ELB 1270A by Lithonia Lighting. The main loads to the MPPT 125 are the high voltage power supply, and an inverter 135, which converts the DC current to an AC current with a desired voltage and frequency, e.g., 120 volts at 60 Hz, as well known in the art.

It is hypothesized that current transferred from the ground electrode 25 to the resonant transformer 45 is not carried by the cables as is conventional household current, but rather travels via "skin effect" on the surface of the conductors. As such, it is prone to generate "step leaders," or the initial fingers of a plasma discharge, on and over cables and components. This presents an electrical shock hazard and is a source of power loss, lowering the system efficiency. Accordingly, as indicated by the dashed line in FIG. 1, the high voltage power supply, spark gap electrodes 90, resonant transformer 45, and coupling capacitor 50 are enclosed in a Faraday cage. In particular, according to one embodiment, the coupling capacitor 50 physically forms a Faraday cage, with the ground terminal of the coupling capacitor 50 forming the grounded shield of the Faraday cage.

Figure 2:
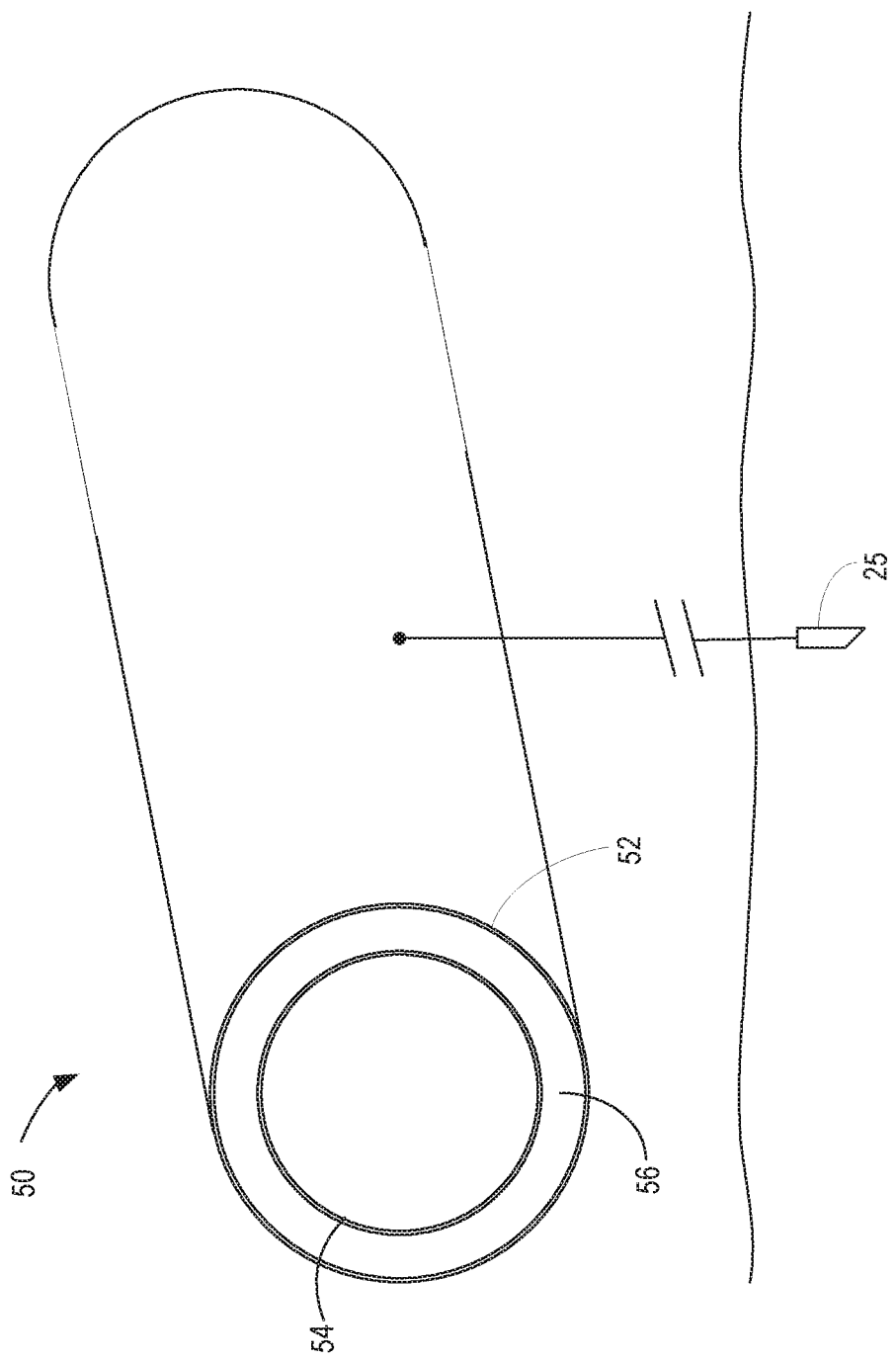
FIG. 2 is a sectional perspective view of a capacitor and Faraday cage.

FIG. 2 depicts a combination coupling capacitor 50 and Faraday cage. A dielectric cylinder 56, such as a 1-foot section of SCH-40 6-inch PVC pipe, or other suitable material, is coated on the exterior by a conductive layer or plate 52 comprising a grounding plane, which is electrically connected to the grounding electrode 25. A suitable exterior plate 52 material is Phifer 3030990 bronze screen (90% copper). The interior of the dielectric 56 is covered by a conductive layer or plate 54, which is electrically connected to the center tap of the primary winding 35 of the resonant transformer 45, which is physically disposed within the Faraday cage 50 but otherwise isolated from the interior plate 54. A suitable interior plate 54 material is 10-mil copper sheet formed about and affixed to the dielectric cylinder 56. Also disposed within the Faraday cage 50 are the high voltage power supply and spark gap electrodes 90.

Although depicted in sectional perspective view in FIG. 2, in practice each end of the Faraday cage 50 is covered with the conductive screen (or plate, mesh, foil, or other conductive material) forming the exterior plate 52, with insulated through-holes for passing the center tap connection, the power supply +/−12 VDC power leads, and connections to the secondary winding 40 of the resonant transformer 45.

Figure 3:
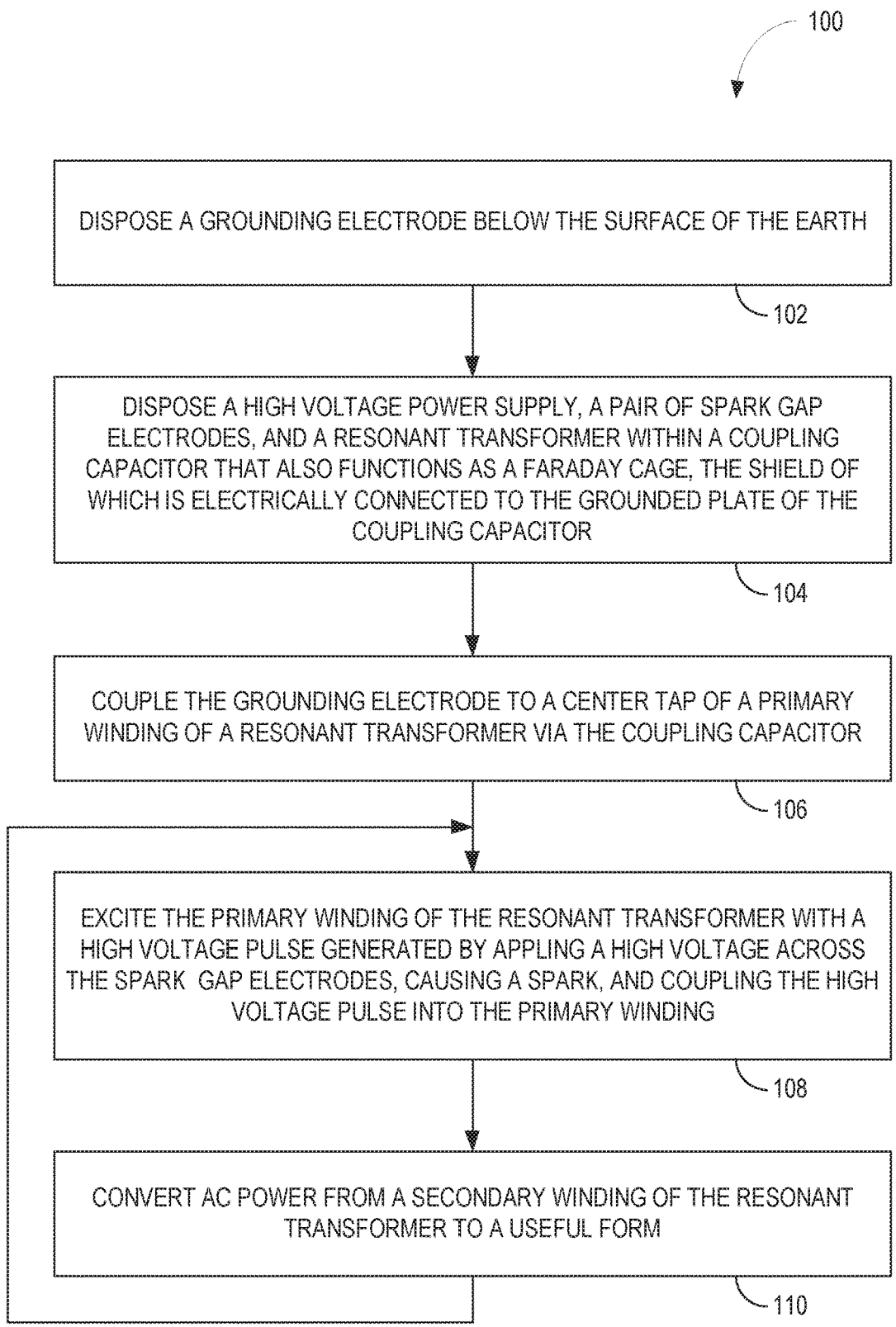
FIG. 3 is a flow diagram of a method of receiving power from the earth.

FIG. 3 depicts the steps of a method 100 of receiving power from the earth. A grounding electrode is disposed below the surface of the earth (block 102). A high voltage power supply, a pair of spark gap electrodes, and a resonant transformer are disposed within a coupling capacitor that also functions as a Faraday cage. The shield of the Faraday cage is electrically connected to the grounded plate of the coupling capacitor (block 104). The coupling capacitor and Faraday cage may, in one embodiment, resemble that depicted in FIG. 2. The Faraday cage completely encloses the electronics, with insulated through-holes for passing electrical conductors.

The grounding electrode is coupled to a center tap of a primary winding of the resonant transformer via the coupling capacitor (block 106). This capacitively couples the center tap of the primary winding to the grounding electrode. The primary winding of the resonant transformer is excited with a high voltage pulse generated by applying a high voltage (i.e., from the high voltage power supply) across the spark gap electrodes, causing a spark, and coupling the high voltage pulse into the primary winding (block 108). The high voltage pulse triggers in-rush current into the resonant transformer, for example in the range of 0.1 to 200 Hz. As used herein, the term "in-rush" current refers to broadband ELF electromagnetic waves from the ground, between 0.1 and 200 Hz, that respond to a lightning strike or a spark in the spark gap. In-rush current balances the potential difference between cloud and ground in the case of lightning, and the voltage difference across the spark gap electrodes in the case of a spark.

AC power from a secondary winding of the resonant transformer is converted to a useful form (block 110), such as by being rectified to DC, filtered, and converted to a useful voltage and current. The DC output may be converted to a useful form, such as AC current at a predetermined voltage and frequency, e.g., 120 V 60 Hz., such as by an inverter.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A power receiver for extracting electrical energy from the earth's electric field, said power receiver comprising:
    a resonant transformer having a primary winding and a secondary winding;
    a high voltage power supply connected across the primary winding of the resonant transformer;
    a pair of electrodes separated by a spark gap, said electrodes interposed between the high voltage power supply and one side of the primary winding of the resonant transformer, and configured to generate a spark when a voltage difference between the electrodes reaches a predetermined level;
    a coupling capacitor connected between the primary winding of the resonant transformer and a ground electrode disposed below the surface of the earth, and operative to capacitively couple the resonant transformer to ground; and
    a power conversion circuit connected to a secondary winding of the resonant transformer to convert electrical current flowing through the secondary winding to a desired form;
    wherein the grounded terminal of the coupling capacitor comprises the shield of a Faraday cage enclosing the high voltage power supply, the electrode pair, and the resonant transformer.

2. The power receiver of claim 1 wherein the power conversion circuit comprises:
    a full bridge rectifier comprising a plurality of diodes and operative to convert AC current from the secondary winding of the resonant transformer to DC current;
    a filter capacitor connected across the rectifier and operative to filter unwanted AC components from the DC current;
    a DC-DC power conversion unit operative to transform the DC current from the rectifier to a useful form.

3. The power receiver of claim 2 wherein the DC-DC power conversion unit comprises a maximum power point tracking (MPPT) charge controller.

4. The power receiver of claim 3 wherein the MPPT charge controller is operative to charge a battery.

5. The power receiver of claim 3 wherein the MPPT charge controller is operative to power the high voltage power supply.

6. The power receiver of claim 3 further comprising:
    an inverter connected to the MPPT charge controller and operative convert DC current from the MPPT charge controller into AC current of a predetermined voltage and frequency.

7. The power receiver of claim 1 wherein the coupling capacitor is connected between the center tap of the primary winding of the resonant transformer and the ground electrode.

8. A method of receiving power from the earth, comprising:
    disposing a grounding electrode below the surface of the earth;
    disposing a high voltage power supply, a pair of spark gap electrodes, and a resonant transformer within a coupling capacitor that also functions as a Faraday cage, the shield of which is electrically connected to the grounded plate of the coupling capacitor;
    coupling the grounding electrode to a primary winding of the resonant transformer via the coupling capacitor;
    exciting the primary winding of the resonant transformer with a high voltage pulse generated by applying a high voltage across the spark gap electrodes, causing a spark, and coupling the high voltage pulse into the primary winding; and
    converting AC power from a secondary winding of the resonant transformer to a useful form.

9. The method of claim 8 further comprising:
    rectifying AC current from the secondary winding of the resonant transformer to DC;
    filtering the DC current; and
    converting the DC current to a useful form.

10. The method of claim 9 wherein converting the DC current to a useful form comprises applying maximum power point tracking (MPPT) conversion to the DC current.

11. The method of claim 10 further comprising:
    converting the output of the MPPT conversion to AC current having a predetermined voltage and frequency.

12. The method of claim 8 wherein coupling the grounding electrode to a primary winding of the resonant transformer comprises coupling the grounding electrode to a center tap of the primary winding of the resonant transformer.

* * * * *